United States Patent [19]

Heimsch et al.

[11] Patent Number: 4,918,640
[45] Date of Patent: Apr. 17, 1990

[54] ADDER CELL HAVING A SUM PART AND A CARRY PART

[75] Inventors: Wolfgang Heimsch; Ernst Muellner, both of Munich, Fed. Rep. of Germany

[73] Assignee: Siemens Aktiengesellschaft, Berlin and Munich, Fed. Rep. of Germany

[21] Appl. No.: 296,070

[22] Filed: Jan. 12, 1989

[30] Foreign Application Priority Data

Feb. 5, 1988 [DE] Fed. Rep. of Germany ....... 3803542

[51] Int. Cl.[4] .......................... G05F 7/50; H03K 17/16
[52] U.S. Cl. .................................... 364/768; 364/784; 364/787; 307/443; 307/570
[58] Field of Search ....................... 364/768, 784, 787; 307/443, 446, 455, 471, 475, 570

[56] References Cited

U.S. PATENT DOCUMENTS

| | | | |
|---|---|---|---|
| 4,718,035 | 1/1988 | Hara et al. | 364/784 |
| 4,740,907 | 4/1988 | Shimizu et al. | 364/784 |
| 4,831,579 | 5/1989 | Hara et al. | |

OTHER PUBLICATIONS

H. Weiss et al., "Integrierte MOS-Schaltungen", Springer-Verlag Verlin-Heidelberg—New York (1982) pp. 188 through 194.

Hotta et al., "CMOS/Bipolar Circuits for 60-MHz Digital Processing", IEEE Journal of Solid-State Circuits, vol. SC-21, No. 5, Oct. 1986, pp. 808–813.

Primary Examiner—Stanley D. Miller
Assistant Examiner—Margaret Rose Wambach
Attorney, Agent, or Firm—Hill, Van Santen, Steadman & Simpson

[57] ABSTRACT

An adder cell having a sum part and a carry part, whereby the sum part and the carry part each contain differential amplifiers having exclusively bipolar or ECL technology as well as differential amplifiers having mixed bipolar MOS transistors. The processing speed can be considerably increased with such an arrangement in comparison to exclusive CMOS adder cells. Additionally, the adder cell carries out a level conversion of CMOS input levels to ECL output levels, so that CMOS levels between 0 and 5 volts can be received at the first four inputs (E1, E2, E3, E4) and ECL boosts in the millivolt range can be taken at the sum outputs (S, $\bar{S}$) or, at the carry outputs (CO, $\overline{CO}$).

19 Claims, 5 Drawing Sheets

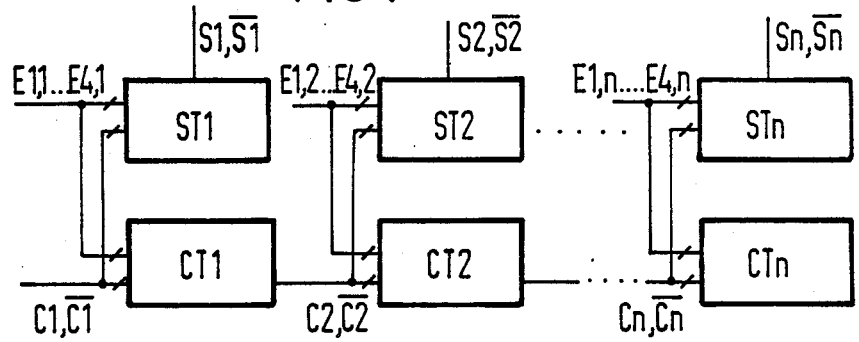
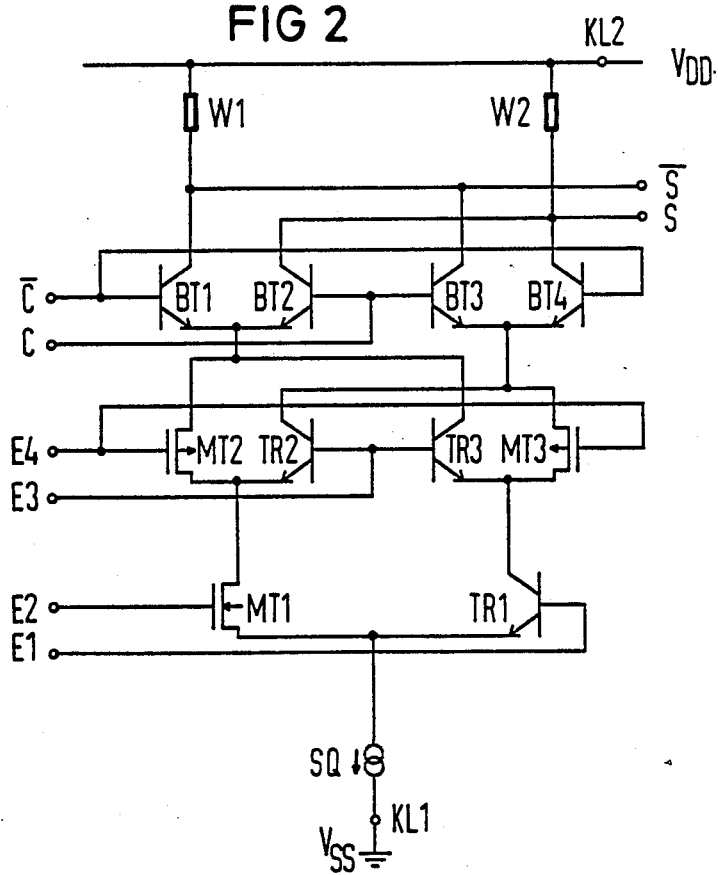

FIG 6

| E1 = $\overline{E2}$ | E2 | E3 = $\overline{E4}$ | E4 | C | $\overline{C}$ | S | $\overline{S}$ | CO | $\overline{CO}$ |
|---|---|---|---|---|---|---|---|---|---|
| 1 | 0 | 1 | 0 | 0 | 1 | 0 | 1 | 0 | 1 |
| 1 | 0 | 1 | 0 | 1 | 0 | 1 | 0 | 0 | 1 |
| 1 | 0 | 0 | 1 | 0 | 1 | 1 | 0 | 0 | 1 |
| 1 | 0 | 0 | 1 | 1 | 0 | 0 | 1 | 1 | 0 |
| 0 | 1 | 1 | 0 | 0 | 1 | 1 | 0 | 0 | 1 |
| 0 | 1 | 1 | 0 | 1 | 0 | 0 | 1 | 1 | 0 |
| 0 | 1 | 0 | 1 | 0 | 1 | 0 | 1 | 1 | 0 |
| 0 | 1 | 0 | 1 | 1 | 0 | 1 | 0 | 1 | 0 |

ADDER CELL HAVING A SUM PART AND A CARRY PART

BACKGROUND OF THE INVENTION

The present invention is directed to an adder cell having a sum part and a carry part.

Adders are required in a great number of digital logic circuits, for example digital filters, signal processors and microprocessors. The simplest principle for such an adder is the "ripple-carry" method wherein a resulting carry is serially transmitted from one adder cell for the least-significant bit to an adder cell for the most significant bit. The through put time of the carry signal essentially determines the addition time. More involved adder principles such as, for example, the known "carry-look-ahead" method are based on elements of the "ripple-carry" method.

Adder cells for constructing adders for the above-recited addition methods in MOS circuit technology are known, for example, from H. Weiss, K. Horninger, "Integrierte MOS-Schaltungen", Springer-Verlag, Berlin-Heidelberg-New York (1982), pages 188 through 194.

In addition to MOS-circuit technology, a bipolar CMOS (BICMOS) circuit technology has been developed in recent years that is particularly used in time-critical and compact circuits. Advantages both from the MOS as well as from the bipolar circuit technology result from "BICMOS" circuits. High packing densities and no static dissipated power that, for example, are characteristic of circuits of CMOS circuit technology, and a low offset voltage as well as an extremely high processing speed that are characteristic of circuits in ECL or in bipolar circuit technology are favorable features of circuits in "BICMOS" circuit technology. CMOS/bipolar circuits for adders are also disclosed in the technical literature. IEEE Journal of Solid State Circuits, Vol. SC-21, No. 5, October 1986, "CMOS/-Bipolar Circuits for 60 MHz Digital Processing" by Takashi Hotta et al discloses a 4-Bit-Arithmetic Unit in FIG. 7 that is composed of half adders, a "carry-generation" circuit and a "carry-propagation" circuit. The "carry-propagation" circuit is disclosed in greater detail in FIG. 8 and on pages 810 and 811, whereby the use of the "BICMOS" circuit technology can also be seen in this figure. The "carry-propagation" circuit contains both MOS transistors as well as a bipolar transistor. CMOS levels between 0 and 5 volts are provided as input signals for this circuit, whereas ECL boosts in the millivolt region can be taken at the output of this circuit.

In the circuit of this latter publication, the conversion of the input level/output level and the logic processing are each undertaken in separate stages. To this end, a bipolar output transistor in FIG. 8 provides for conversion into CMOS level, whereas the remaining MOS transistors of the circuit are responsible for the logic function of the circuit. Such a circuit does not fully exploit the speed advantages of the "BICMOS" circuit technology. The known adder cells in MOS circuit technology are burdened by the disadvantage that either a relatively great plurality of gates are inserted into the carry path that is time-critical for the overall calculating time of an arithmetic unit constructed with such adder cells and/or that the gates inserted into the carry path are component parts of combination gates. In the former instance, the plurality of gates connected in series has an unfavorable influence on the throughput time of carry signals. In the latter instance, the fact that the charging of the capacitance of the carry output does not occur with the required edge steepness due to the relatively high-impedance of the gates which are component parts of combination gates, may have an additionally negative effect under certain conditions.

SUMMARY OF THE INVENTION

An object of the present invention is to provide adder cells having a summation part and a carry part wherein the disadvantages of prior art adder cells with respect to the carry path can be effectively avoided and that, moreover, require low surface and power consumption.

This object is inventively achieved by an adder cell having a sum part and a carry part. The sum part contains a first differential amplifier having a first MOS transistor (MT1) and a first transistor (TR1), a second differential amplifier having a second MOS transistor (MT2) and a second transistor (TR2), a third differential amplifier having a third MOS transistor (MT3) and a third transistor (TR3), a fourth differential amplifier composed of first and second bipolar transistors (BT1, BT2), a fifth differential amplifier composed of third and fourth bipolar transistors (BT3, BT4), a current source (SQ) and first and second resistors (W1, W2); a first terminal of the first MOS transistor (MT1) and a first terminal of the first transistor (TR1) being connected in common to a first circuit terminal (KL1) via the current source (SQ); a first terminal of the second MOS transistor (MT2) and a first terminal of the second transistor (TR2) being connected to a second terminal of the first MOS transistor (MT1), and a first terminal of the third MOS transistor (MT3) and a first terminal of the third transistor (TR3) being connected to a second terminal of the first transistor (TR1); a first terminal of the first bipolar transistor (BT1) and a first terminal of the second bipolar transistor (BT2) being connected to a second terminal of the second MOS transistor (MT2) and to a second terminal of the third transistor (TR3); a first terminal of the third bipolar transistor (BT3) and a first terminal of the fourth bipolar transistor (BT4) being connected to a second terminal of the second transistor (TR2) and to a second terminal of the third MOS transistor (MT3); a second terminal of the first bipolar transistor (BT1) and a second terminal of the third bipolar transistor (BT3) being connected in common to a second circuit terminal (KL2) via the first resistor (W1); a second terminal of the second bipolar transistor (BT2) and a second terminal of the fourth bipolar transistor (BT4) being connected in common to the second circuit terminal (KL2) via the second resistor (W2); a first input (E1) being connected to a control terminal of the first transistor (TR1) and a second input (E2) being connected to a gate terminal of the first MOS transistor (MT1); a control terminal of the second transistor (TR2) and a control terminal of the third transistor (TR3) connected together to form a third input (E3); a gate terminal of the second MOS transistor (MT2) and a gate terminal of the third MOS transistor (MT3) connected together to form a fourth input (E4); a first carry input (C) being connected to a base terminal of the second bipolar transistor (BT2) and to a base terminal of the third bipolar transistor (BT3); a second carry input ($\overline{C}$) being connected to a base terminal of the first bipolar transistor (BT1) and to a base terminal of the fourth bipolar transistor (BT4); a first sum output (S) being connected to the second terminal of the fourth bipolar transistor (BT4) and to the second terminal of the second bipolar transistor (BT2); a second sum output ($S$) being connected to the second terminal of the first bipolar (BT1) and to the second terminal of the third bipolar transistor (BT3).

The carry part contains a first differential amplifier having a first MOS transistor (MT1) and a first transistor (TR1), a second differential amplifier having a second MOS transistor (MT2) and a second transistor (TR2), a third differential amplifier having a third MOS transistor (MT3) and a third transistor (TR3), a fourth differential amplifier composed of first and second bipolar transistors (BT1, BT2), a current source (SQ) and first and second resistors (W1, W2); a first terminal of the first MOS-transistor (MT1) and a first terminal of the first transistor (TR1) being connected in common to a first circuit terminal (KL1) via the current source (SQ); a first terminal of the second MOS transistor (MT2) and a first terminal of the second transistor (TR2) being connected to a second terminal of the first MOS transistor (MT1), and a first terminal of the third transistor (TR3) and a first terminal of the third MOS transistor (MT3) being connected to a second terminal of the first transistor (TR1); a first terminal of the first bipolar transistor (BT1) and a first terminal of the second bipolar transistor (BT2) being connected to a second terminal of the second MOS transistor (MT2) and to a second terminal of the third transistor (TR3); a second terminal of the second transistor (TR2) and a second terminal of the second bipolar transistor (BT2) being connected in common to a second circuit terminal (KL2) via the first resistor (W1), and a second terminal of the first bipolar transistor (BT1) and a second terminal of the third MOS transistor (MT3) being connected in common to the second circuit terminal (KL2) via a second resistor (W2); a first input (E1) being connected to a control terminal of the first transistor (TR1) and a second input (E2) being connected to a gate terminal of the first MOS transistor (MT1); a control terminal of the second transistor (TR2) and a control terminal of the third transistor (TR3) connected together to form a third input (E3); a gate terminal of the second MOS transistor (MT2) and a gate terminal of the third MOS transistor (MT3) connected together to form a fourth input (E4); a first carry input (C) being connected to a base terminal of the second bipolar transistor (BT2) and a second carry input ($\overline{C}$) being connected to a base terminal of the first bipolar transistor (BT1); a second terminal of the first bipolar transistor (BT1) and a second terminal of the third MOS transistor (MT3) connected together to form a first carry output (CO) and a second terminal of the second transistor (TR2) and a second terminal of the second bipolar transistor (BT2) connected together to form a second carry output ($\overline{CO}$).

The advantages obtained with the present invention are that the adder cell having a sum part and a carry part exhibits a considerably higher processing speed than adder cells in MOS circuit technology. The advantages of the bipolar or ECL circuit technology such as low offset voltage and fast processing speed are further advantages of this adder cell.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 is a block diagram of the interconnection of the adder cells, each having a sum part and a carry part to form an overall adder;

FIG. 2 is a circuit diagram of a first exemplary embodiment of the sum part of the adder cell;

FIG. 6 is a truth table for the adder cell.

DESCRIPTION OF THE PREFERRED EMBODIMENT

Figure 3:
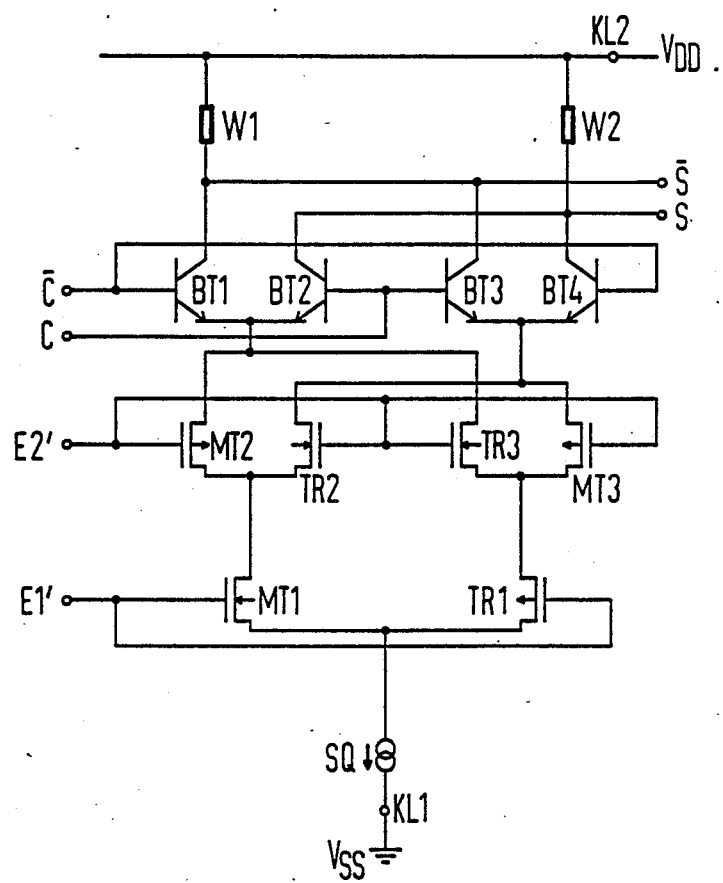
FIG. 3 is a circuit diagram of a second exemplary embodiment of the sum part of the adder cell.

FIG. 1 shows the interconnection of n adder cells each having a sum part and a carry part. Respective input signals are connected onto the four inputs E1,1 ... E4,1 and two carry input signals are connected onto the two carry inputs C1, $\overline{C1}$ at the first adder cell composed of a first sum part ST1 and of a first carry part CT1. The two carry input signals are placed on a fixed "0" or "1" level in the first carry part CT1. Carry output signals from the first carry part CT1 simultaneously form the carry input signals at the two carry inputs C2, $\overline{C2}$ for the second carry part CT2 of the second adder cell. These carry input signals are likewise connected onto the second sum part ST2 of the second adder cell. The second sum part ST2 as well as the second carry part CT2 are likewise again connected with input signals at the four inputs E1,2 ... E4,2. The recited interconnection is valid for all remaining adder cells, so that the $n^{th}$ adder cell having the $n^{th}$ sum part STn and the $n^{th}$ carry part CTn is in turn respectively connected with carry input signals at two carry inputs Cn, $\overline{Cn}$ and is respectively connected with input signals at four inputs E1,n ... E4,n. Each of the individual adder cells has two sum outputs that are referenced S1, $\overline{S1}$ for the first sum part, S2, $\overline{S2}$ for the second sum part and, respectively, Sn, $\overline{Sn}$ for the $n^{th}$ sum part. The occurrence of input signals for the individual adder cells is dependent on the selected exemplary embodiment of the sum part or of the carry part. This shall be set forth again in greater detail in the following FIGS. 2 through 6. The carry input signals at the carry inputs C1, $\overline{C1}$, C2, $\overline{C2}$ or Cn, $\overline{Cn}$ as well as the sum output signals at the sum outputs S1, $\overline{S1}$, S2, $\overline{S2}$ or Sn, $\overline{Sn}$ each contained complementary signals. The individual carry signals or the sum output signals are specified again in greater detail in FIG. 6 in tabular form.

FIG. 2 shows a first exemplary embodiment of a sum part of the adder cell. The sum part contains a first differential amplifier having a first MOS transistor MT1 and a first transistor TR1, a second differential amplifier having a second MOS transistor MT2 and a second transistor TR2, a third differential amplifier having a third MOS transistor MT3 and a third transistor TR3, a fourth differential amplifier composed of first and second bipolar transistors BT1, BT2, and a fifth differential amplifier composed of third and fourth bipolar transistors BT3, BT4 as well as a constant current source SQ and first and second resistors W1 and W2. According to FIG. 2, a first terminal of the first MOS transistor MT1 and a first terminal of the first transistor TR1 are connected in common to a first circuit terminal KL1 via the constant current source SQ1, a first terminal of the second MOS transistor MT2 and a first terminal of the second transistor MT2, are connected to a second terminal of the first MOS transistor MT1 and a first terminal of the third MOS transistor MTS and a first terminal of the third transistor TR3 are connected to a second terminal of the first transistor TR1. A first terminal of the first bipolar transistor BT1 and a first terminal of the second bipolar transistor BT2 are connected to a second terminal of the second MOS transistor MT2 and to a second terminal of the third transistor TR3, and a first terminal of the third bipolar transistor BT3 and a first terminal of the fourth bipolar transistor BT4 are connected to a second terminal of the second transistor TR2 and to a second terminal of the third MOS transistor MT3. A second terminal of the first bipolar transistor BT1 and a second terminal of the third bipolar transistor BT3 are connected in common to a second circuit terminal KL2 via a first resistor W1 and a second terminal of the second bipolar transistor BT2 and a second terminal of the fourth bipolar transistor BT4 are likewise connected in common to the second circuit terminal KL2 via a second resistor W2.

A first input E1 is connected to a control terminal of the first transistor TR1, a second input E2 is connected to a gate terminal of the first MOS transistor MT1, a control terminal of the second transistor TR2 and a control terminal of the third transistor TR3 are connected together to form a third input E3 and a gate terminal of the second MOS transistor MT2 and a gate terminal of the third MOS transistor MT3 are connected together to form a fourth input E4. A first carry input C for a non-inverted carry signal is connected to a base terminal of the second bipolar transistor BT2 and to a base terminal of the third bipolar transistor BT3, whereas a second carry input $\overline{C}$ for an inverted carry signal is connected to a base terminal of the first bipolar transistor BT1 and to a base terminal of the fourth bipolar transistor BT4.

According to FIG. 2, a first sum output S for a non-inverted sum output signal is connected to the second terminal of the fourth bipolar transistor BT4 and to the second terminal of the second bipolar transistor BT2, whereas a second terminal of the first bipolar transistor BT1 and a second terminal of the third bipolar transistor BT3 are connected together to form a second sum output $\overline{S}$ for an inverted sum output signal. The first circuit terminal KL1 in the sum part is connected to the ground $V_{ss}$ and the second circuit terminal KL2 is connected to a supply voltage $V_{DD}$.

The sum part of the adder cell of FIG. 2 has an n-channel MOS transistor for the first MOS transistor MT1, p-channel MO transistors for the second and third MOS transistors MT2, MT3, and npn bipolar transistors for the first, second and third transistors TR1, TR2, TR3 as well as for the first, second, third and fourth bipolar transistors BT1, BT2, BT3 and BT4.

In this exemplary embodiment, the CMOS input signals to be added are connected onto the second and fourth inputs E2, E4, whereas appropriate reference signals within the low and high level of the CMOS input signals are applied to the first and third inputs E1, E3.

The speed of the sum part can be considerably increased compared to an embodiment in exclusive CMOS circuit technology by utilizing the "BICMOS" circuit technology. Due to the design of the fourth and fifth differential amplifiers in bipolar or ECL technology, the especially time-critical path for the carry signals exhibits an especially high processing speed. Whereas CMOS levels between 0 and 5 volts are required at the input side E1, E2, E3 and E4, only ECL boosts in the millivolt region are required for the carry signals at the first and second carry inputs C, $\overline{C}$. The two sum outputs S, $\overline{S}$ likewise supply ECL boosts that lie between 0 and a few 100 millivolts. This is the case when the first and second resistors W1, W2 have values of approximately 200 ohms. The output boost of the sum signal at the sum outputs S, $\overline{S}$, however, depends not only on the resistors W1 and W2 but is likewise dependent on the constant current source SQ that can be realized both in bipolar as well as in MOS circuit technology. The space advantage results from a significantly lower number of component parts, this being created in that level converters that convert CMOS circuit levels to ECL levels are eliminated. The power advantage of the sum part of FIG. 2 results from the smaller plurality of transverse currents in the circuit.

A different configuration of the transistors is also possible for the sum part of FIG. 2. The first MOS transistor MT1 and the first transistor TR1 are thereby n-channel MOS transistors, the second and third MOS transistors MT2, MT3 and the second and third transistors TR2, TR3 are p-channel MOS transistors and the first, second, third and fourth bipolar transistors BT1, BT2, BT3 and BT4 are npn bipolar transistors. The advantage is a lower area requirement, whereas the longer transit time through the greater number of MOS transistors reduces the processing speed of the sum part. This latter embodiment requires complementary input signals, so that an input signal at the first input E1 requires a complementary input signal for the input signal at the second input E2 and an input signal at the third input E3 requires a complementary input signal for the input signal at the fourth input E4.

A second possible embodiment for the sum part is shown in FIG. 3. The interconnection is fundamentally the same as in the sum part of FIG. 2, so that the same reference characters are used in FIG. 2 and in FIG. 3. However, the first MOS transistor MT1, the second and third transistors TR2 and TR3 in the sum part are nchannel MOS transistors and the first transistor TR1 and the second and third MOS transistors MT2, MT3 in the sum part are p-channel MOS transistors, whereas the first, second, third and fourth bipolar transistors BT1, BT2, BT3 and BT4 are again npn bipolar transistors. Complementary input signals are no longer required due to the embodiment of the sum part of FIG. 3 and the inputs can be combined in pairs to form first and second common inputs E1', E2'. The first common input E1' is established by a common interconnection of the first and second inputs E1, E2 and the second common input E2' is established by a common interconnection of the third and fourth inputs E3, E4. The advantage of a smaller space requirement again results for the sum part of FIG. 3 since complementary input signals are not required. A lower processing speed compared to a sum part in the first exemplary embodiment of FIG. 2 is a disadvantage.

Figure 4:
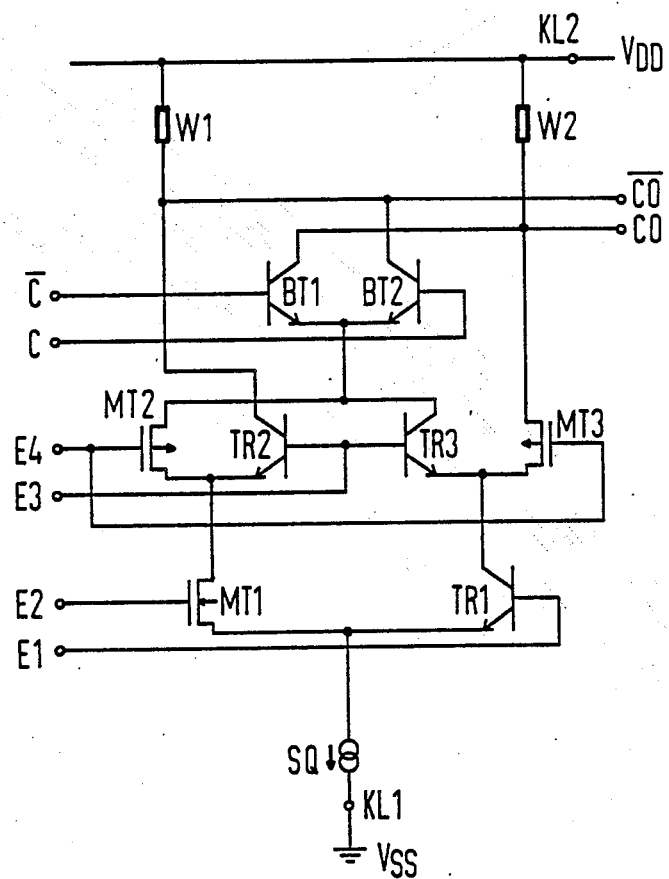
FIG. 4 is a circuit diagram of a first exemplary embodiment of the carry part of the adder cell.

FIG. 4 shows a first exemplary embodiment of the carry part of the adder cell. The carry part contains a first differential amplifier having a first MOS transistor MT1 and a first transistor TR1, a second differential amplifier having a second MOS transistor MT2 and a second transistor TR2, a third differential amplifier having a third MOS transistor MT3 and a third transistor TR3 and a fourth differential amplifier composed of first and second bipolar transistors BT1, BT2, as well as a constant current source SQ and first and second resistors W1, W2. A first terminal of the first MOS transistor MT1 and a first terminal of the first transistor TRI are connected in common to a first circuit terminal KL1 via the constant current source SQ, a first terminal of the second MOS transistor MT2 and a first terminal of the second transistor TR2 are connected to a second terminal of the first MOS transistor MT1, and a first terminal of the third transistor TR3 and a first terminal of the third MOS transistor MT3 are connected to a second terminal of the first transistor TR1. A first terminal of the first bipolar transistor BT1 and a first terminal of the second bipolar transistor BT2 are connected in common to a second terminal of the second MOS transistor MT2 and to a second terminal of the third transistor TR3, whereas a second terminal of the second transistor TR2 and a second terminal of the second bipolar transistor BT2 are connected in common to a second circuit terminal KL2 via a first resistor W1. A second terminal of the first bipolar transistor BT1 and a second terminal of the third MOS transistor MT3 are likewise connected in common to the second circuit terminal KL2 via a second resistor W2. According to FIG. 4, a first input E1 is connected to a control terminal of the first transistor TR1, a second input E2 is connected to a gate terminal of the first MOS transistor MT1, whereas a control terminal of the second transistor TR2 and a control terminal of the third transistor TR3 are connected together to form a third input E3 and a gate terminal of the second MOS transistor MT2 and a gate terminal of the third MOS transistor MT3 are connected together to form a fourth input E4.

A first carry input C for a non-inverted carry signal is connected to a base terminal of the second bipolar transistor BT2 and a second carry input $\overline{C}$ for an inverted carry signal is connected to a base terminal of the first bipolar transistor BT1. A second terminal of the first bipolar transistor BT1 and a second terminal of the MOS transistor MT3 are connected together to form a first carry output CO for a non-inverted carry output signal and a second terminal of the second transistor TR2 and a second terminal of the second bipolar transistor BT2 are connected together to form a second carry output CO for an inverted carry signal. In the carry part according to FIG. 4, the first circuit terminal KL1 is connected to the ground $V_{ss}$ and the second circuit terminal KL2 is connected to a supply voltage $V_{DD}$. The first MOS transistor MT1 in the carry part is an n-channel MOS transistor, the second and third MOS transistors MT2, MT3 are p-channel MOS transistors whereas the first, second and third transistors TR1, TR2 and TR3 as well as the first and second bipolar transistors BT1, BT2 are npn bipolar transistors.

In this exemplary embodiment, the CMOS input signals to be added are connected onto the second and fourth inputs E2, E4, whereas appropriate reference signals within the low and high level of the CMOS input signals are applied to the first and third inputs E1, E3.

For a comparison of the sum part of FIG. 2 and the carry part of FIG. 4, the differential amplifiers in both circuits are interconnected according to a "series gating" principle. Also the time-critical paths particularly the carry path, in both circuits are executed in bipolar or ECL technology; a level conversion between CMOS and ECL levels as well as logical operation of the input signals is carried out by the first three differential amplifiers in both circuits.

A further modification of the carry part of FIG. 4 results in that the first MOS transistor MT1 and the first transistor TR1 are n-channel MOS transistors, the second and third MOS transistor MT2 and MT3 as well as the second and third MOS transistor MT2 and MT3 as well as the second and third transistors TR2 and TR3 are p-channel MOS transistors and the first and second bipolar transistors BT1, BT2 are npn bipolar transistors. Such an embodiment makes it necessary to operate the carry part of FIG. 4 with opposite phase input signals. In this case, the input signal at the input E1 exhibits an input signal that has an opposite phase relative to an input signal at the second input E2 and the input signal at the third input E3 exhibits an input signal that has an opposite phase to an input signal at the fourth input E4. The advantage of this modification lies in a lower space requirement; for such a realization, however, there is a longer running time of the input signals in the circuit and, thus a lower processing speed.

Figure 5:
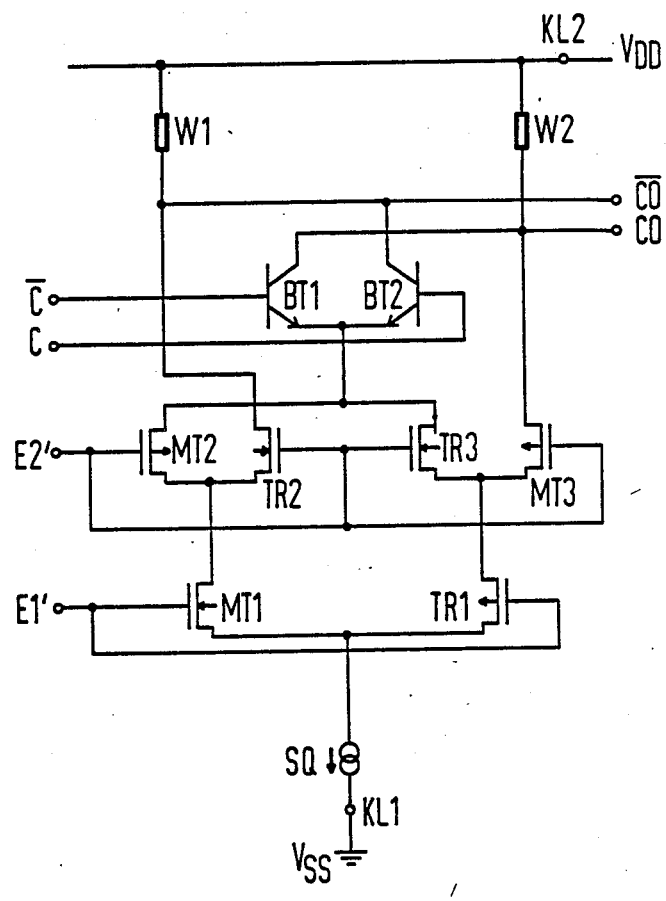
FIG. 5 is a circuit diagram of a second exemplary embodiment of the carry part of the adder cell.

FIG. 5, finally, shows a second exemplary embodiment of a carry part for the adder cell, whereby the fundamental structure of the circuit corresponds to the carry part of FIG. 4. Identical reference characters are used in FIG. 4 and in FIG. 5 for this reason. Bipolar transistors in the first three differential amplifiers here are again replaced by MOS transistors, such that respectively complementary transistors form a current switch. The first MOS transistor MT1 and the second and third transistors TR2 and TR3 are n-channel M transistors, and the second and third MOS transistors (MT2, MT3) are p-channel MOS transistors whereas the first and second bipolar transistors BT1, BT2 are npn bipolar transistors. This circuit has the advantage of a lower space requirement. No complementary input signals are required here, so that the first and second inputs E1, E2 can be combined to form a first, common input E1' and the third and fourth inputs E3, E4 can be combined to form a common, second input E2'. The somewhat lower processing speed in comparison to the circuit of FIG. 4 is likewise disadvantageous in this second exemplary embodiment.

The selection of the MOS transistor type of n-channel or p-channel in the circuits of FIGS. 2 through 5 occurs such that the MOS transistor size is minimal, this being dependent on the respective substrate bias of the MOS transistor. It is likewise possible to use only one MOS transistor type in the sum part or in the carry part.

FIG. 6 shows a truth table for a carry part and for a sum part of an adder cell that has complementary input signals. In both circuits in this case, the first MOS transistor MT1 and the first transistor TR1 are n-channel MOS transistors, the second and third MOS transistors MT2, MT3 and the second and third transistors TR2 and TR3 are p-channel MOS transistors and the first and second bipolar transistors of FIG. 4 or respectively, the first, second, third and fourth bipolar transistors BT1, BT2, BT3 and BT4 of FIG. 2 are npn bipolar transistors. The complementary input signals to the second input E2 are shown in the first column E1=$\overline{E2}$, whereas the complementary input signals of the fourth input E4 are shown in the third input E3=$\overline{E4}$. A first and second carry input C, $\overline{C}$ for a non-inverted and inverted carry signal are also shown in the truth table of FIG. 6. The output signals at the sum output S and $\overline{S}$ are shown in the truth table for the sum part of the adder cell, whereas the output signals at the carry output CO or $\overline{CO}$ are shown for the carry part.

The remaining lines, for example, the third line in the truth table of FIG. 6 indicates that a high level appears at the sum output S or a low level appears at the sum output $\overline{S}$ precisely when the first and fourth input E1 and E4 as well as the carry input $\overline{C}$ are connected to a high level and the second and third input E2, E3 as well as the carry input C are connected to a low level. In this case, a low level can be taken at the carry output CO and a high level can be taken at the carry output $\overline{CO}$. Thus for the sum part or the carry part of FIG. 2 or FIG. 4 the first transistor TR1 is transmissive and the first MOS transistor MT1 is inhibited, the second and third MOS transistors MT2, MT3 are inhibited and the second and third transistors TR2, TR3 are conductive. The first and fourth bipolar transistors BT1, BT4 in the sum part of FIG. 2 or the first bipolar transistor BT1 in the carry part of FIG. 4 is inhibited whereas the second and third bipolar transistor BT2, BT3 in the sum part of FIG. 2 or the second bipolar transistor BT2 in the carry part are inhibited. As a result in the sum part of FIG. 2 a high level can be taken at the first sum output S and a low level can be taken at the second sum output $\overline{S}$ and in the carry part of FIG. 4 a low level can be taken at the first carry output CO and a high level can be taken at the second carry output $\overline{CO}$.

The invention is not limited to the particular details of the apparatus depicted and other modification and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An adder cell having a sum part and a carry part, comprising the sum part containing a first differential amplifier having a first MOS transistor (MT1) and a first transistor (TR1), a second differential amplifier having a second MOS transistor (MT2) and a second transistor (TR2), a third differential amplifier having a third MOS transistor (MT3) and a third transistor (TR3), a fourth differential amplifier composed of first and second bipolar transistors (BT1, BT2), a fifth differential amplifier composed of third and fourth bipolar transistors (BT3, BT4), a current source (SQ) and first and second resistors (W1, W2); a first terminal of the first MOS transistor (MT1) and a first terminal of the first transistor (TR1) being connected in common to a first circuit terminal (KL1) via the current source (SQ); a first terminal of the second MOS transistor (MT2) and a first terminal of the second transistor (TR2) being connected to a second terminal of the first MOS transistor (MT1), and a first terminal of the third MOS transistor (MT3) and a first terminal of the third transistor (TR3) being connected to a second terminal of the first transistor (TR1); a first terminal of the first bipolar transistor (BT1) and a first terminal of the second bipolar transistor (BT2) being connected to a second terminal of the second MOS transistor (MT2) and to a second terminal of the third transistor (TR3); a first terminal of the third bipolar transistor (BT3) and a first terminal of the fourth bipolar transistor (BT4) being connected to a second terminal of the second transistor (TR2) and to a second terminal of the third MOS transistor (MT3); a second terminal of the first bipolar transistor (BT1) and a second terminal of the third bipolar transistor (BT3) being connected in common to a second circuit terminal (KL2) via the first resistor (W1); a second terminal of the second bipolar transistor (BT2) and a second terminal of the fourth bipolar transistor (BT4) being connected in common to the second circuit terminal (KL2) via the second resistor (W2); a first input (E1) being connected to a control terminal of the first transistor (TR1) and a second input (E2) being connected to a gate terminal of the first MOS transistor (MT1); a control terminal of the second transistor (TR2) and a control terminal of the third transistor (TR3) connected together to form a third input (E3); a gate terminal of the second MOS transistor (MT2) and a gate terminal of the third MOS transistor (MT3) connected together to form a fourth input (E4); a first carry input (C) being connected to a base terminal of the second bipolar transistor (BT2) and to a base terminal of the third bipolar transistor (BT3); a second carry input ($\overline{C}$) being connected to a base terminal of the first bipolar transistor (BT1) and to a base terminal of the fourth bipolar transistor (BT4); a first sum output (S) being connected to the second terminal of the fourth bipolar transistor (BT4) and to the second terminal of the second bipolar transistor (BT2); a second sum output ($\overline{S}$) being connected to the second terminal of the first bipolar (BT1) and to the second terminal of the third bipolar transistor (BT3).

2. The adder cell according to claim 1, wherein, in the sum part, the first MOS transistor (MT1) is an n-channel MOS transistor, the second and third MOS transistors (MT2, MT3) are p-channel MOS transistors and the first, second and third transistors (TR1, TR2, TR3) as well as the first, second, third and fourth bipolar transistors (BT1, BT2, BT3, BT4) are npn bipolar transistors.

3. The adder cell according to claim 1, wherein in the sum part, the first MOS transistor (MT1) and the first transistor (TR1) are n-channel MOS transistors, the second and third MOS transistors (MT2, MT3) and the second and third transistors (TR2, TR3) are p-channel MOS transistors and the first, second, third and fourth bipolar transistors (BT1, BT2, BT3, BT4) are npn bipolar transistors.

4. The adder cell according to claim 1, wherein, in the sum part, the first MOS transistor (MT1) and the second and third transistors (TR2, TR3) are n-channel MOS transistors, the first transistor (TR1) and the second and third MOS transistors (MT2, MT3) are p-channel MOS transistors and the first, second, third and fourth bipolar transistors (BT1, BT2, BT3, BT4) are npn bipolar transistors; and wherein the first and second inputs (E1, E2) form a first, common input (E1') and the third and fourth inputs (E3, E4) form a second, common input (E2').

5. An adder cell having a sum part and a carry part, comprising the carry part containing a first differential amplifier having a first MOS transistor (MT1) and a first transistor (TR1), a second differential amplifier having a second MOS transistor (MT2) and a second transistor (TR2), a third differential amplifier having a third MOS transistor (MT3) and a third transistor (TR3), a fourth differential amplifier composed of first and second bipolar transistors (BT1, BT2), a current source (SQ) and first and second resistors (W1, W2); a first terminal of the first MOS transistor (MT1) and a first terminal of the first transistor (TR1) being connected in common to a first circuit terminal (KL1) via the current source (SQ); a first terminal of the second MOS transistor (MT2) and a first terminal of the second transistor (TR2) being connected to a second terminal of the first MOS transistor (MT1), and a first terminal of the third transistor (TR3) and a first terminal of the third MOS transistor (MT3) being connected to a second terminal of the first transistor (TR1); a first terminal of the first bipolar transistor (BT1) and a first terminal of the second bipolar transistor (BT2) being connected to a second terminal of the second MOS transistor (MT2) and to a second terminal of the third transistor (TR3); a second terminal of the second transistor (TR2) and a second terminal of the second bipolar transistor (BT2) being connected in common to a second circuit terminal (KL2) via the first resistor (W1), and a second terminal of the first bipolar transistor (BT1) and a second terminal of the third MOS transistor (MT3) being connected in common to the second circuit terminal (KL2) via a second resistor (W2); a first input (E1) being connected to a control terminal of the first transistor (TR1) and a second input (E2) being connected to a gate terminal of the first MOS transistor (MT1); a control terminal of the second transistor (TR2) and a control terminal of the third transistor (TR3) connected together to form a third input (E3); a gate terminal of the second MOS transistor (MT2) and a gate terminal of the third MOS transistor (MT3) connected together to form a fourth input (E4); a first carry input (C) being connected to a base terminal of the second bipolar transistor (BT2) and a second carry input ($\overline{C}$) being connected to a base terminal of the first bipolar transistor (BT1); a second terminal of the first bipolar transistor (BT1) and a second terminal of the third MOS transistor (MT3) connected together to form a first carry output (CO) and a second terminal of the second transistor (TR2) and a second terminal of the second bipolar transistor (BT2) connected together to form a second carry output ($\overline{CO}$).

6. The adder cell according to claim 5, wherein in the carry part, the first MOS transistor (MT1) is a n-channel MOS transistor, the second and third MOS transistors (MT2, MT3) are p-channel MOS transistors and the first, second and third transistors (TR1, TR2, TR3) as well as the first and second bipolar transistors (BT1, BT2) are npn bipolar transistors.

7. The adder cell according to claim 5, wherein, in the carry part, the first MOS transistor (MT1) and the first transistor (TR1) are n-channel MOS transistors, the second and third MOS transistors (MT2, MT3) as well as the second and third transistors (TR2, TR3) are p-channel MOS transistors and the first and second bipolar transistors (BT1, BT2) are npn bipolar transistors.

8. The adder cell according to claim 5, wherein in the carry part, the first MOS transistor (MT1) and the second and third transistor (TR2, TR3) are n-channel MOS transistors, the second and third MOS transistors (MT2, MT3) are p-channel MOS transistors and the first and second bipolar transistors (BT1, BT2) are npn bipolar transistors, the first and second inputs (E1, E2) forming a first common input (E1')and the third and fourth inputs forming second common input (E2').

9. The adder cell according to claim 5, wherein the first circuit terminal (KL1) is connected to ground ($V_{ss}$) and the second circuit terminal (KL2) is connected to the supply voltage ($V_{DD}$).

10. The adder cell according to claim 1, wherein the first circuit terminal (KL1) is connected to ground ($V_{ss}$) and the second circuit terminal (KL2) is connected to the supply voltage ($V_{DD}$).

11. An adder cell having a sum part and a carry part, comprising: the sum part containing a first sum differential amplifier having a first sum MOS transistor (MT1) and a first sum transistor (TR1), a second sum differential amplifier having a second sum MOS transistor (MT2) and a second sum transistor (TR2), a third sum differential amplifier having a third sum MOS transistor (MT3) and a third sum transistor (TR3), a fourth sum differential amplifier composed of first and second sum bipolar transistors (BT1, BT2), a fifth sum differential amplifier composed of third and fourth sum bipolar transistors (BT3, BT4), a sum current source (SQ) and first and second sum resistors (W1, W2); a first terminal of the first sum MOS transistor (MT1) and a first terminal of the first sum transistor (TR1) being connected in common to a first sum circuit terminal (KL1) via the sum current source (SQ); a first terminal of the second sum MOS transistor (MT2) and a first terminal of the second sum transistor (TR2) being connected to a second terminal of the first sum MOS transistor (MT1), and a first terminal of the third sum MOS transistor (MT3) and a first terminal of the third sum transistor (TR3) being connected to a second terminal of the first sum transistor (TR1); a first terminal of the first sum bipolar transistor (BT1) and a first terminal of the second sum bipolar transistor (BT2) being connected to a second terminal of the second sum MOS transistor (MT2) and to a second terminal of the third sum transistor (TR3); a first terminal of the third sum bipolar transistor (BT3) and a first terminal of the fourth sum bipolar transistor (BT4) being connected to a second terminal of the second sum transistor (TR2) and to a second terminal of the third sum MOS transistor (MT3); a second terminal of the first sum bipolar transistor (BT1) and a second terminal of the third sum bipolar transistor (BT3) being connected in common to a second sum circuit terminal (KL2) via the first sum resistor (W1); a second terminal of the second sum bipolar transistor (BT2) and a second terminal of the fourth sum bipolar transistor (BT4) being connected in common to the second sum circuit terminal (KL2) via the second sum resistor (W2); a first input (E1) being connected to a control terminal of the first transistor sum (TR1) and a second input (E2) being connected to a gate terminal of the first sum MOS transistor (MT1); a control terminal of the second sum transistor (TR2) and a control terminal of the third sum transistor (TR3) connected together to form a third input (E3); a gate terminal of the second sum MOS transistor (MT2) and a gate terminal of the third sum MOS transistor (MT3) connected together to form a fourth input (E4); a first carry input (C) being connected to a base terminal of the second sum bipolar transistor (BT2) and to a base terminal of the third sum bipolar transistor (BT3); a second carry input ($\overline{C}$) being connected to a base terminal of the first sum bipolar transistor (BT1) and to a base terminal of the fourth sum bipolar transistor (BT4); a first sum output (S) being connected to the second terminal of the fourth sum bipolar transistor (BT4) and to the second terminal of the second sum bipolar transistor (BT2); a second sum output ($\overline{S}$) being connected to the second terminal of the first sum bipolar (BT1) and to the second terminal of the third sum bipolar transistor (BT3); the carry part containing a first carry differential amplifier having a first carry MOS transistor (MT1) and a first carry transistor (TR1'), a second carry differential amplifier carry transistor (TR2'), a third carry differential amplifier having a third carry MOS transistor (MT3') and a third carry transistor (TR3'), a fourth carry differential amplifier composed of first and second carry bipolar transistors (BT1', BT2'), a carry current source (SQ') and first and second carry resistors (W1', W2'); or first terminal of the first carry MOS transistor (MT1) and a terminal of the first carry transistor (TR1') being connected in common to a first carry circuit terminal (KLI') via the carry current source (SQ'); a first terminal of the second carry MOS transistor (MT2') and a first terminal of the second carry transistor (TR2') being connected to a second terminal of the first carry MOS transistor (MT1'), and a first terminal of the third carry transistor (TR3') and a first terminal of the third carry MOS transistor (MT3') being connected to a second terminal of the first carry transistor (TR1'); a first terminal of the first carry bipolar transistor (BT1') and a first terminal of the second carry bipolar transistor (BT2') being connected to a second terminal of the second carry MOS transistor (MT2') and to a second terminal of the third carry transistor (TR3'); second terminal of the second carry transistor (TR2') and a second terminal of the second carry bipolar transistor (BT2') being connected in common to a second carry circuit terminal (KL2') via the first carry resistor (W1'), and a second terminal of the first carry bipolar transistor (BT1') and a second terminal of the third carry MOS transistor (MT3') being connected in common to the second carry circuit terminal (KL2') via a second carry resistor (W2'); the first input (E1) being connected to a control terminal of the first carry transistor (TR1') and the second input (E2) being connected to a gate terminal of the first carry MOS transistor (MT1'); a control terminal of the second carry transistor (TR2') and a control terminal of the third carry transistor (TR3') connected together to form the third input (E3); a gate terminal of the second carry MOS transistor (MT2') and a gate terminal of the third carry MOS transistor (MT3') connected together to form the fourth input (E4); the first carry input (C) being connected to a base terminal of the second carry bipolar transistor (BT2') and the second carry input ($\overline{C}$) being connected to a base terminal of the first carry bipolar transistor (BT1'); a second terminal of the first carry bipolar transistor (BT1') and a second terminal of the third carry MOS transistor (MT3') connected together to form a first carry output (CO) and a second terminal of the second carry transistor (TR2') and a second terminal of the second carry bipolar transistor (BT2') connected together to form a second carry output ($\overline{CO}$).

12. The adder cell according to claim 11, wherein, in the sum part, the first sum MOS transistor (MT1) is an n-channel MOS transistor, the second and third sum MOS transistors (MT2, MT3) are p-channel MOS transistors and the first, second and third sum transistors (TR1, TR2, TR3) as well as the first, second, third and fourth sum bipolar transistors (BT1, BT2, BT3, BT4) are npn bipolar transistors.

13. The adder cell according to claim 11, wherein, in the sum part, the first sum MOS transistor (MT1) and the first sum transistor (TR1) are n-channel MOS transistors, the second and third sum MOS transistors (MT2, MT3) and the second and third sum transistors (TR2, TR3) are p-channel MOS transistors and the first, second, third and fourth sum bipolar transistors (BT1, BT2, BT3, BT4) are npn bipolar transistors.

14. The adder cell according to claim 11, wherein, in the sum part, the first sum MOS transistor (MT1) and the second and third sum transistors (TR2, TR3) are n-channel MOS transistors, the first sum transistor (TR1) and the second and third sum MOS transistors (MT2, MT3) are p-channel MOS transistors and the first, second, third and fourth sum bipolar transistors (BT1, BT2, BT3, BT4) are npn bipolar transistors; and wherein the first and second inputs (E1, E2) form a first, common input (E1') and the third and fourth inputs (E3, E4) form a second, common input (E2').

15. The adder cell according to claim 11, wherein, in the carry part, the first carry MOS transistor (MT1') is a n-channel MOS transistor, the second and third carry MOS transistors (MT2', MT3') are p-channel MOS transistors and the first, second and third carry transistors (TR1', TR2', TR3') as well as the first and second carry bipolar transistors (BT1', BT2') are npn bipolar transistors.

16. The adder cell according to claim 11, wherein, in the carry part, the first carry MOS transistor (MT1') and the first carry transistor (TR1') are n-channel MOS transistors, the second and third carry MOS transistors (MT2', MT3') as well as the second and third carry transistors (TR2', TR3') are p-channel MOS transistors and the first and second carry bipolar transistors (BT1', BT2') are npn bipolar transistors.

17. The adder cell according to claim 11, wherein, in the carry part, the first carry MOS transistor (MT1') and the second and third carry transistor (TR2', TR3') are n-channel MOS transistors, the second and third carry MOS transistors (MT2', MT3') are p-channel MOS transistors and the first and second carry bipolar transistors (BT1', BT2') are npn bipolar transistors, the first and second inputs (E1, E2) forming a first common input (E1') and the third and fourth inputs (E3, E4) forming a second common input (E2').

18. The adder cell according to claim 11, wherein, the first sum circuit terminal (KL1) is connected to ground ($V_{ss}$) and the second sum circuit terminal (KL2) is connected to the supply voltage ($V_{DD}$).

19. The adder cell according to claim 11, wherein, the first carry circuit terminal (KL1') is connected to ground ($V_{ss}$) and the second carry circuit terminal (KL2') is connected to the supply voltage ($V_{DD}$).

* * * * *